(12) United States Patent
Moriwaki et al.

(10) Patent No.: US 7,477,334 B2
(45) Date of Patent: Jan. 13, 2009

(54) METHOD OF MANUFACTURING ELECTRO-OPTICAL DEVICE

(75) Inventors: Minoru Moriwaki, Fujimi-machi (JP); Masahiro Yasukawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 114 days.

(21) Appl. No.: 11/425,569

(22) Filed: Jun. 21, 2006

(65) Prior Publication Data

US 2007/0028390 A1    Feb. 8, 2007

(30) Foreign Application Priority Data

Aug. 5, 2005    (JP) .............................. 2005-227571

(51) Int. Cl.
*G02F 1/1333*    (2006.01)
(52) U.S. Cl. .............................. 349/40; 438/22; 438/29; 438/42; 438/43; 438/44; 257/E33.066
(58) Field of Classification Search .................. 438/22, 438/30, 29, 42, 43, 44; 349/40
See application file for complete search history.

(56) References Cited

U.S. PATENT DOCUMENTS 6,084,648 A * 7/2000 Yeo .............................. 349/40

| | | | |
|---|---|---|---|
| 6,734,940 B2 | 5/2004 | Hirabayashi | |
| 2001/0028415 A1 | 10/2001 | Hirabayashi | |
| 2002/0158298 A1 * | 10/2002 | Yamada | ...................... 257/471 |

FOREIGN PATENT DOCUMENTS

JP    B2 3395598    2/2003
KR    A-2001-091977    10/2001

* cited by examiner

*Primary Examiner*—Sue A Purvis
*Assistant Examiner*—Minchul Yang
(74) *Attorney, Agent, or Firm*—Oliff & Berridge, PLC

(57) ABSTRACT

A method of manufacturing an electro-optical device, which, on a substrate, has a plurality of data lines, a plurality of scanning lines, a plurality of driving elements formed to correspond to intersections of the plurality of data lines and the plurality of scanning lines for pixels, and a plurality of pixel electrodes provided to correspond to the driving elements, includes forming an etching stopping layer, forming a common line that is provided above the etching stopping layer to short-circuit the plurality of scanning lines and the plurality of scanning lines, forming a first interlayer insulating film that isolates the plurality of data lines and the plurality of pixel electrodes from the plurality of scanning lines and the plurality of driving elements, forming contact holes that electrically connect the plurality of data lines and the plurality of pixel electrodes to the plurality of driving elements, forming the plurality of data lines, and forming a cutting hole in the first interlayer insulating film by etching so as to cut the common line.

8 Claims, 8 Drawing Sheets

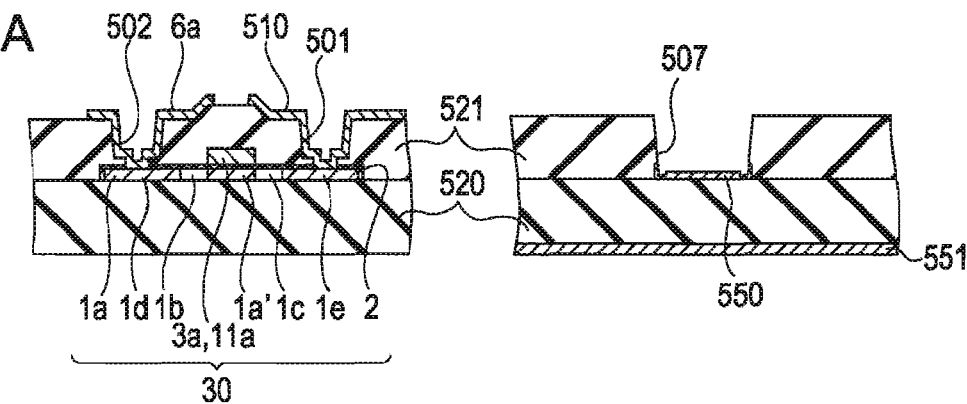
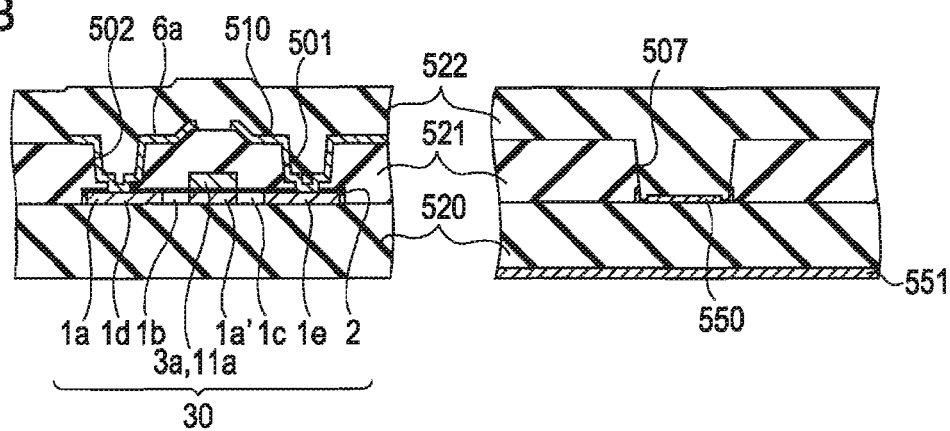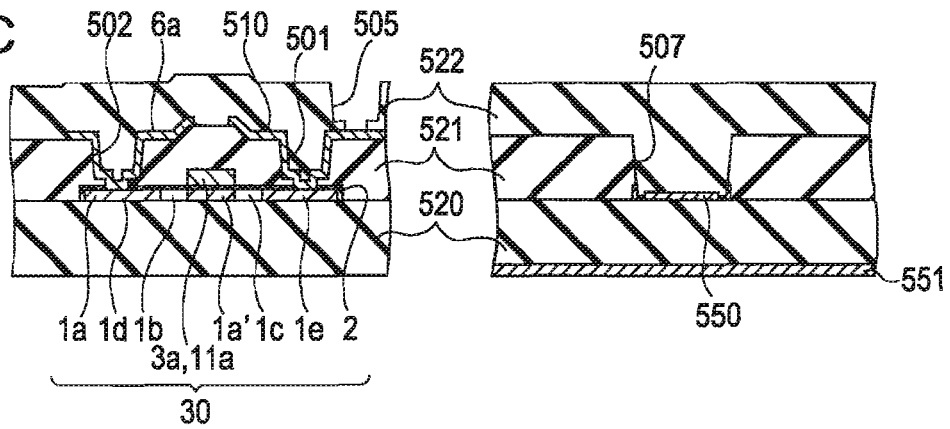

METHOD OF MANUFACTURING ELECTRO-OPTICAL DEVICE

BACKGROUND

1. Technical Field

The present invention relates to a method of manufacturing an electro-optical device, and in particular, relates to a method of manufacturing an electro-optical device that has a plurality of data lines, a plurality of scanning lines, and a plurality of driving elements on a substrate.

2. Related Art

In general, as electro-optical device that has, on an insulating substrate, a plurality of data lines and a plurality of scanning lines, a plurality of driving elements formed to correspond to intersections of the plurality of data lines and the plurality of scanning lines for individual pixels, and pixel electrodes provided to correspond to the driving elements, an active matrix driving mode liquid crystal device has been known.

When manufacturing an active matrix driving mode liquid crystal device, on the insulating substrate, a semiconductor layer or various conductive films are formed by a dry etching method or a plasma CVD (Chemical Vapor Deposition) method, and thus pixel electrodes, data lines, scanning lines, pixel switching thin film transistors (hereinafter referred to as TFTs) electrically connected to the scanning lines and the data lines, and so on are formed. In this case, an unexpected excess current may be caused by electric charges or an electrostatic charge accumulated on the surface of a substrate due to film formation by the plasma CVD method or the like. Due to the excess current, the scanning line may be damaged. In particular, a dielectric breakdown may occur between a gate of a TFT that is connected to the scanning line or is to be a part of the scanning line and a source/drain thereof.

For this reason, in Japanese Patent No. 3395598, there is disclosed a technology which, in order to prevent the occurrence of the excess current, forms short-circuit wiring lines to be electrically connected to the plurality of scanning lines, respectively, and disperses the electric charges or the electrostatic charge outside the substrate. In Japanese Patent No. 3395598, after the TFTs and so on are formed, the short-circuit wiring lines are cut, such that the scanning lines are electrically separated from one another.

A method of cutting the short-circuit wiring lines is as follows. First, when a contact hole for electrically connecting the pixel electrode and the TFT is formed in an interlayer insulating film for isolating the TFT from the pixel electrode, a short-circuit portion cutting hole that extends from the surface of the interlayer insulating film to the short-circuit wiring line is simultaneously formed. Then, after a conductive film for forming the pixel electrode is formed, when the conductive film is patterned using a photolithography method and an etching method, a short-circuit portion of the scanning line is simultaneously cut through the cutting hole.

However, in the related art, since the conductive film is formed after the cutting hole for cutting the short-circuit wiring line is formed, the conductive film is also formed at the bottom and side wall portions of the cutting hole. Further, when conductive film is patterned, a resist for forming the pixel electrode is laminated in the cutting hole. When the resist is patterned by the photolithography method, an aspect ratio of the cutting hole is made large. Accordingly, even through exposure accuracy is increased, the resist may remain in the cutting hole, and the short-circuit wiring line may be not cut. Therefore, in order to reliably cut the short-circuit wiring line, the resist and the conductive film in the cutting hole need to be completely removed. Therefore, when cutting the short-circuit wiring line, etching needs to be excessively performed in order to simultaneously remove the conductive film and the resist in the cutting hole.

A base insulating film serving as an interlayer insulating film is formed below the short-circuit wiring line, and a lower light-shielding film is formed below the base insulating film. When etching is excessively performed in the cutting hole, the base insulating film below the cutting hole may be thinned or etching may reach the lower light-shielding film. Accordingly, a crack may occur in the lower light-shielding film in the periphery of the cutting hole, and a display inconsistency may occur due to light leakage from the cracked portion. As a result, manufacturing yield of a liquid crystal device may be degraded.

SUMMARY

An advantage of some aspects of the invention is that it provides a method of manufacturing an electro-optical device that can realize a manufacturing process of an electro-optical device capable of stably obtaining high-quality display.

According to an aspect of the invention, there is provided a method of manufacturing an electro-optical device that, on a substrate, has a plurality of data lines, a plurality of scanning lines, a plurality of driving elements formed to correspond to intersections of the plurality of data lines and the plurality of scanning lines for pixels, and a plurality of pixel electrodes provided to correspond to the driving elements. The method of manufacturing an electro-optical device includes forming an etching stopping layer, forming a common line that is provided above the etching stopping layer so as to short-circuit the plurality of scanning lines and the plurality of scanning lines, forming a first interlayer insulating film that isolates the plurality of data lines and the plurality of pixel electrodes from the plurality of scanning lines and the plurality of driving elements, forming, in the first interlayer insulating film, contact holes that electrically connect the plurality of data lines and the plurality of pixel electrodes to the plurality of driving elements, forming the plurality of data lines, and forming a cutting hole in the first interlayer insulating film by etching so as to cut the common line.

According to this configuration, when the common line for short-circuiting the plurality of scanning lines provided in order to prevent the plurality of driving elements or the plurality of data lines from being damaged due to an excess current unexpectedly generated by an electrostatic charge or the like is cut by etching through the cutting hole, an etching processing stops by an etching stopping layer formed below the common line. For this reason, for example, etching does not have an influence on a light-shielding film formed below the etching stopping layer. Therefore, it is possible to manufacture an electro-optical device that does not have a display inconsistency due to cracks in the light-shielding film.

In the method of manufacturing an electro-optical device according to the aspect of the invention, the forming of the etching stopping layer may be performed simultaneously with forming a semiconductor film constituting the plurality of driving elements.

In the method of manufacturing an electro-optical device according to the aspect of the invention, the forming of the etching stopping layer may be performed simultaneously with forming a semiconductor film constituting the plurality of driving elements or forming gate electrodes constituting the plurality of driving elements.

According to this configuration, the etching stopping layer can be formed without increasing the number of processes.

In the method of manufacturing an electro-optical device according to the aspect of the invention, the forming of the etching stopping layer may form the etching stopping layer wider than the cutting hole so as to include the cutting hole in plan view.

According to this configuration, since etching for cutting the common line is performed within a formation range of the etching stopping layer, it is possible to reliably stop etching in the etching stopping layer.

In the method of manufacturing an electro-optical device according to the aspect of the invention, the forming of the common line and forming of the plurality of scanning lines are performed simultaneously with forming the gate electrodes constituting the plurality of driving elements.

According to this configuration, since the plurality of scanning lines and the common line can be formed simultaneously with a part of the forming of the driving elements, the unexpected excess current due to the electrostatic charge and so on can be prevented, and simultaneously a manufacturing process can be simplified.

In the method of manufacturing an electro-optical device according to the aspect of the invention, the forming of the common line and forming of the plurality of scanning lines may be performed after forming gate electrodes constituting the plurality of driving elements, and the forming of the common line and the forming of the plurality of scanning lines may be simultaneously performed.

BRIEF DESCRIPTION OF THE DRAWINGS

The invention will be described with reference to the accompanying drawings, wherein like numbers reference like elements.

FIGS. 8A to 8C are cross-sectional views sequentially showing the configuration of a TFT array substrate in individual steps of a manufacturing process.

DESCRIPTION OF EXEMPLARY EMBODIMENTS

Hereinafter, an embodiment of the invention will be described with reference to the drawings. In the embodiment, an electro-optical device of the invention is applied to a liquid crystal device.

Figure 1:
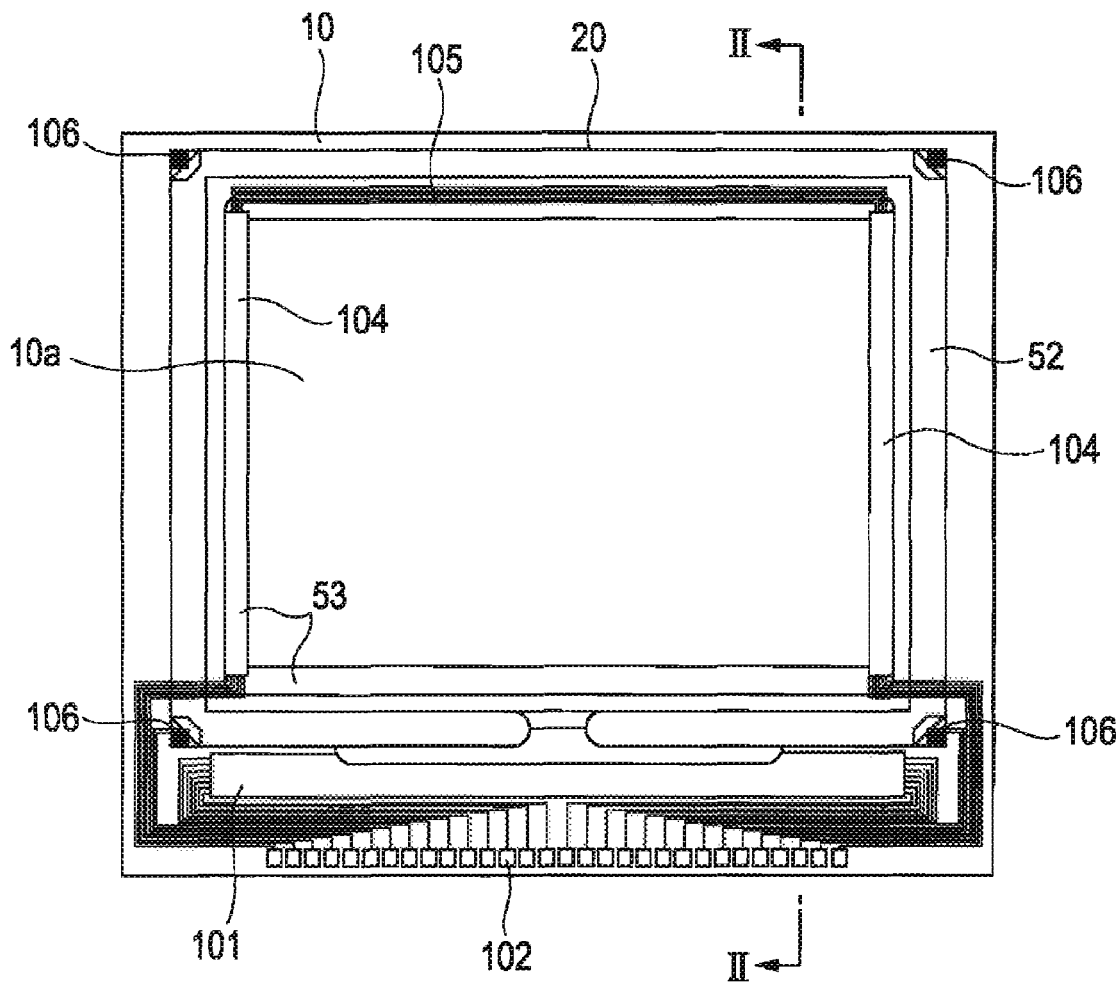
FIG. 1 is a plan view showing the overall configuration of an electro-optical device according to an embodiment of the invention.
Figure 2:
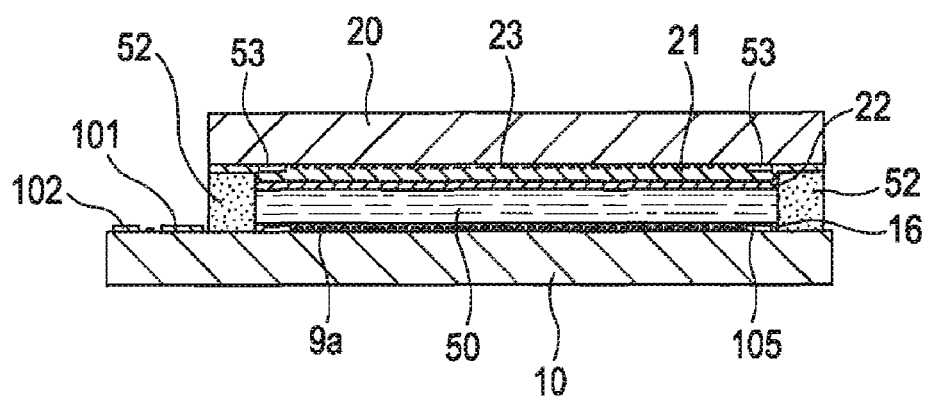
FIG. 2 is a cross-sectional view taken along the line II-II of FIG. 1

An electro-optical device according to an embodiment of the invention will be described with reference to FIGS. 1 to 93. First, the overall configuration of an electro-optical device according to this embodiment will be described with reference to FIGS. 1 and 2. Here, FIG. 1 is a plan view of an electro-optical device when a TFT array substrate is viewed, together with the parts formed thereon, from a counter substrate. FIG. 2 is a cross-sectional view taken along the line II-II of FIG. 1. Here, a TFT active matrix driving mode liquid crystal device having a driving circuit built-in is illustrated as an example of an electro-optical device.

Referring to FIGS. 1 and 2, in the electro-optical device of this embodiment, a TFT array substrate 10 and a counter substrate 20 are arranged to face each other. The TFT array substrate 10 and the counter substrate 20 are bonded to each other by a sealant 52 which is provided in a sealing region in a periphery of an image display region 10a. A liquid crystal layer 50 is filled between the TFT array substrate 10 and the counter substrate 20. Further, gap materials, such as glass fiber or glass beads, are scattered and provided in the sealant 52 so as to make a gap between the TFT array substrate 10 and the counter substrate 20 at a predetermined values Inside the sealing region where the sealant 52 is disposed, a frame-shaped light-shielding film 53 that defines a frame region of the image display region 10a is provided on the counter substrate 20. Alternatively, the frame-shaped light-shielding film 53 may be partially or entirely provided as an internal light-shielding film on the TFT array substrate 10. In this embodiment, a peripheral region is located in the periphery of the image display region 10a. Specifically, in this embodiment, a region beyond the frame-shaped light-shielding film 53 is defined as the peripheral region as viewed from the center of the TFT array substrate 10.

In a region located outside the sealing region, in which the sealant 52 is disposed, from the peripheral region, a data line driving circuit 101 and external circuit connecting terminals 102 are provided along one side of the TFT array substrate 10. Further, scanning line driving circuits 104 are provided along two sides adjacent to the one side of the TFT array substrate 10, on which the data line driving circuit 101 and the external circuit connecting terminals 102 are provided, so as to be covered with the frame-shaped light-shielding film 53. In addition, the two scanning line driving circuit 104 are connected to each other by a plurality of wiring lines 105 that are provided along the last side of the TFT array substrate 10, that is, along a side opposite to the one side of the TFT array substrate 10, on which the data line driving circuit 101 and the external circuit connecting terminals 102 are provided, so as to be covered with the frame-shaped light-shielding film 53.

At four corners of the counter substrate 20, vertical connecting members 106 are disposed so as to function as vertical connecting terminals for electrical connection between the counter substrate 20 and the TFT array substrate 10. Meanwhile, on the TFT array substrate 10, vertical connecting terminals are provided in regions facing the vertical connecting members 106. The TFT array substrate 10 and the counter substrate 20 are electrically connected to each other through the vertical connecting members 106 and the vertical connecting terminals.

In FIG. 2, after pixel switching TFTs or wiring lines, such as scanning lines, data lines, and so on, are formed on the TFT array substrate 10, an alignment film 16 is formed on pixel electrodes 9a. Meanwhile, a lattice or stripe-shaped light-shielding film 23 and an alignment film 22 as an uppermost layer are formed on counter substrate 20, in addition to a counter electrode 21. Further, the liquid crystal layer 50 is formed of liquid crystal in which one or several types of nematic liquid crystal are mixed and has a predetermined alignment state between the pair of alignment films 16 and 22.

On the TFT array substrate 10 shown in FIGS. 1 and 2, in addition to the data line driving circuit 101, the scanning line driving circuits 104, and so on, a sampling circuit that samples image signals on image signal lines and supplies the sampled image signals to the data lines, a precharge circuit that supplies a precharge signal having a predetermined voltage level to the plurality of data lines prior to the image signals, and a test circuit that tests for detects, the quality, and so on of the electro-optical device during manufacturing or at the time of shipping may be formed.

Figure 3:
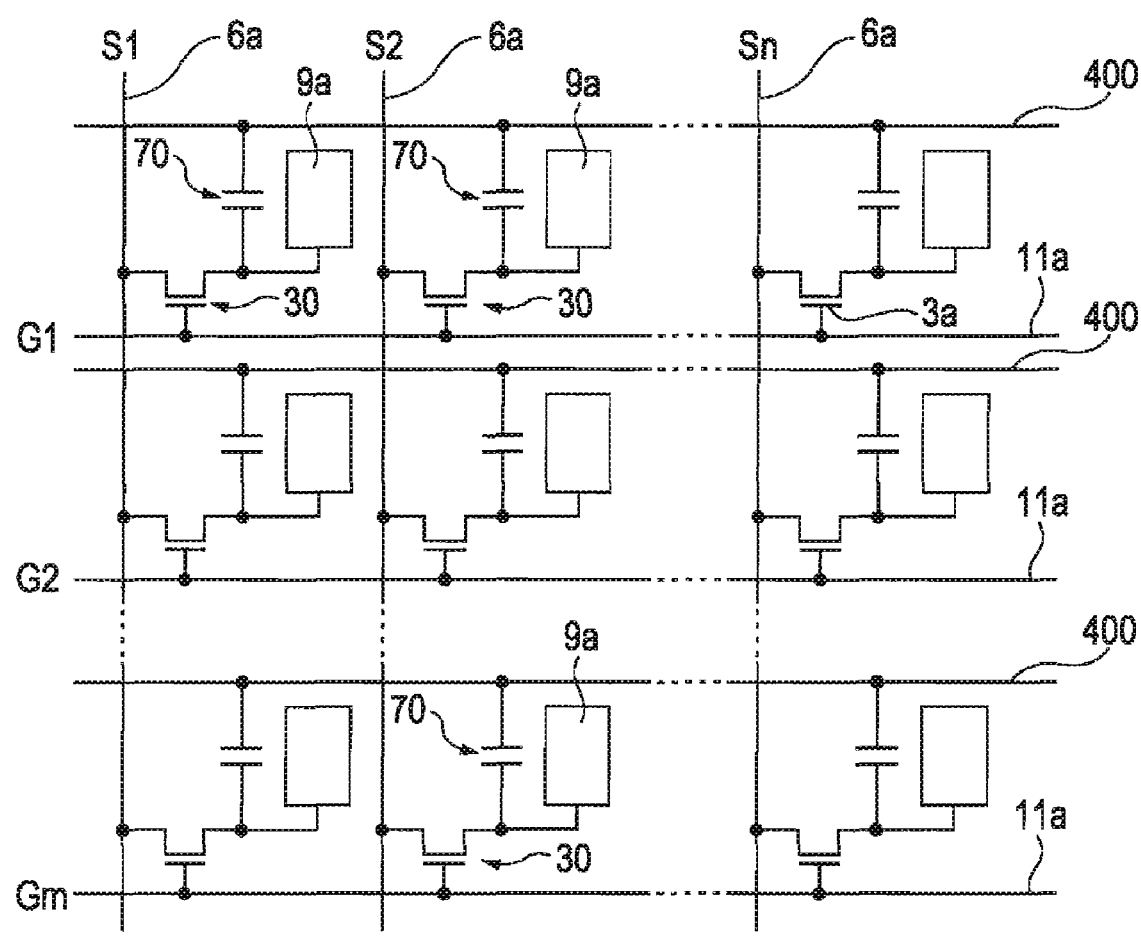
FIG. 3 is an equivalent circuit diagram of various elements, wiring lines, and so on in a plurality of pixels formed in a matrix shape constituting an image display region of an electro-optical device.

Next, the electrical configuration of the electro-optical device described above will be described with reference to FIG. 3. FIG. 3 is an equivalent circuit diagram of various elements, wiring lines, and so on in a plurality of pixels formed in a matrix shape constituting an image display region of an electro-optical device.

As shown in FIG. 3, in each of a plurality of pixels formed in a matrix shape constituting the image display region of the electro-optical device in this embodiment, the pixel electrode 9a and the TFT 30 for switching control of the pixel electrode 9a are formed. The data lines 6, to which the image signals are supplied, are electrically connected to sources of the TFTs 30, respectively. Image signals S1, S2, . . . , and Sn, which are to be written into the data lines 6a, may be linear-sequentially in that order or may be supplied to a plurality of adjacent data lines 6a in groups.

Gate electrodes 3a are electrically connected to gates of the TFTs 30, respectively. Scanning signals G1, G2, . . . , and Gm are linear-sequentially applied in a pulsed manner to scanning lines la and the gate electrodes 3a at a predetermined timing. The pixel electrodes 9a are electrically connected to drains of the TFTs 30, respectively. Then, if the TFTs 30 serving as the switching elements are turned on for a predetermined period, the image signals S1, S2, . . . , and Sn that are supplied from the data lines 6a are written into the pixels corresponding to the selected scanning line 11a at a predetermined timing.

The image signals S1, S2, . . . , and Sn having predetermined levels written into the pixels are held between the pixel electrodes 9a and the counter electrode formed on the counter substrate for a predetermined period. The alignment or order of liquid crystal molecules of liquid crystal changes according to the applied voltage level, such that gray-scale display by light modulation can be performed. In case of a normally white mode, transmittance of incident light decreases according to the applied voltage of each pixel. Meanwhile, in case of a normally black mode, transmittance of incident light increases according to the applied voltage of each pixel. As a whole, light having contrast according to the image signal is emitted from the electro-optical device.

In order to prevent leakage of the held image signals, a storage capacitor 70 is added in parallel with a liquid crystal capacitor which is formed between the pixel electrode 9a and the counter electrode. The storage capacitor 70 is provided in parallel with the scanning line 11a, and a fixed-potential capacitor electrode thereof is connected to a capacitor wiring line 40n that is fixed at a constant potential.

In this embodiment, for example, during forming the TFT array substrate 10 by a plasma CVD method or the like, in order to prevent the accumulation of charges to the TFT array substrate 10, the scanning lines 11a are formed to be short-circuited to one another on the TFT array substrate 10, and the short-circuit portions are cut after the TFTs 30 and so on are formed.

Figure 4:
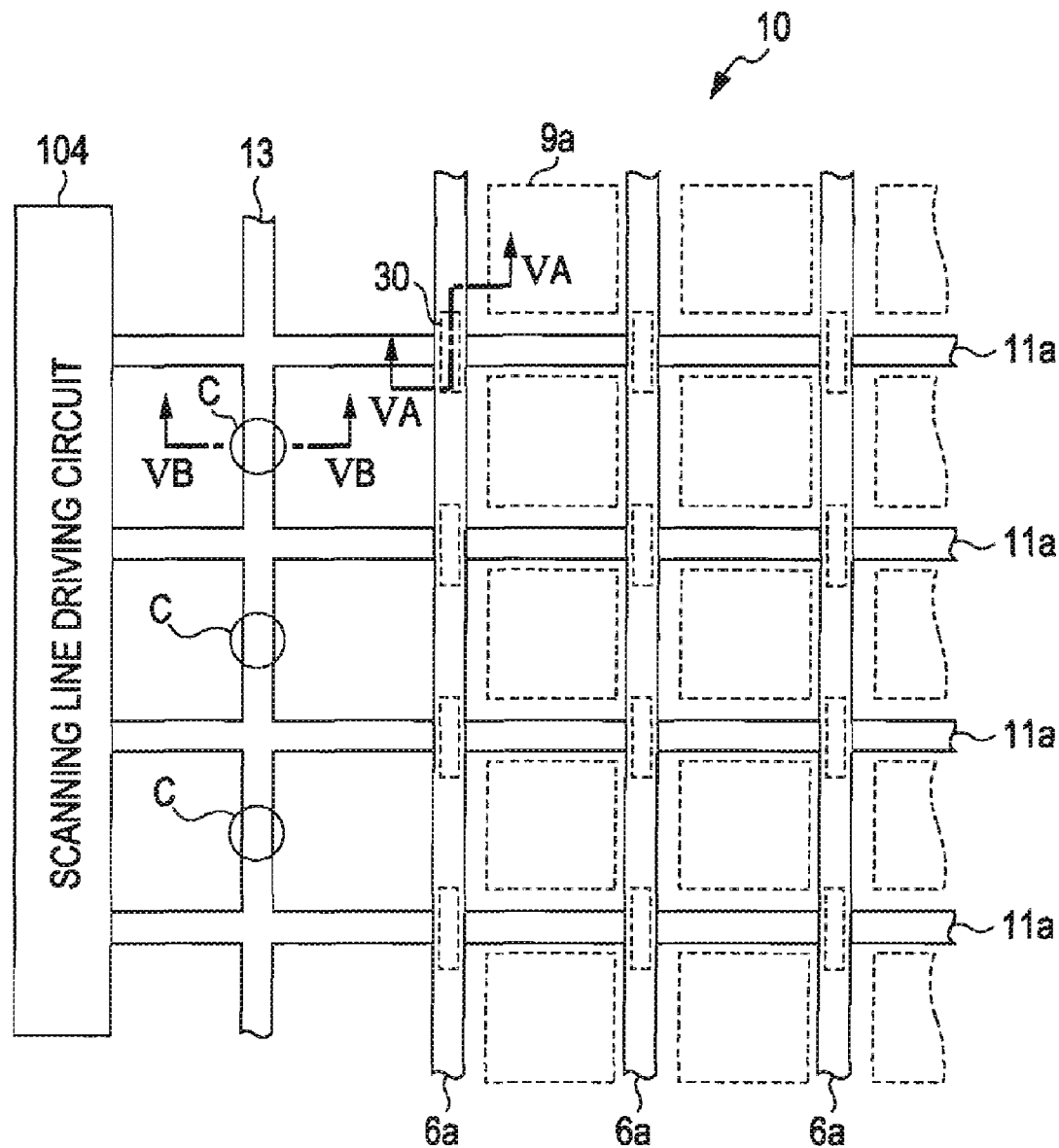
FIG. 4 is a diagram showing the configuration of a short-circuit portion of a scanning line.

FIG. 4 is a diagram schematically showing an example of the configuration of short-circuit portions of the scanning lines 11a. On the TFT array substrate 10, a plurality of scanning lines 11a are formed below a plurality of data lines 6a to be described below. Then, in the peripheral region on the TFT array substrate 10, in the same layer as the scanning lines 11a, a common line 13 for short-circuiting the scanning lines 11a is formed of the same film as the conductive film for forming the scanning lines 11a. The individual scanning lines 11a are electrically connected to the common line 13 to be then short-circuited to one another. In this embodiment, after the scanning lines 11a are formed, the short-circuit portions C are cut. The detailed description of the formation of the scanning lines 11a or cutting of the short-circuit portions C of the scanning lines 11a will be described below.

Figure 5A:
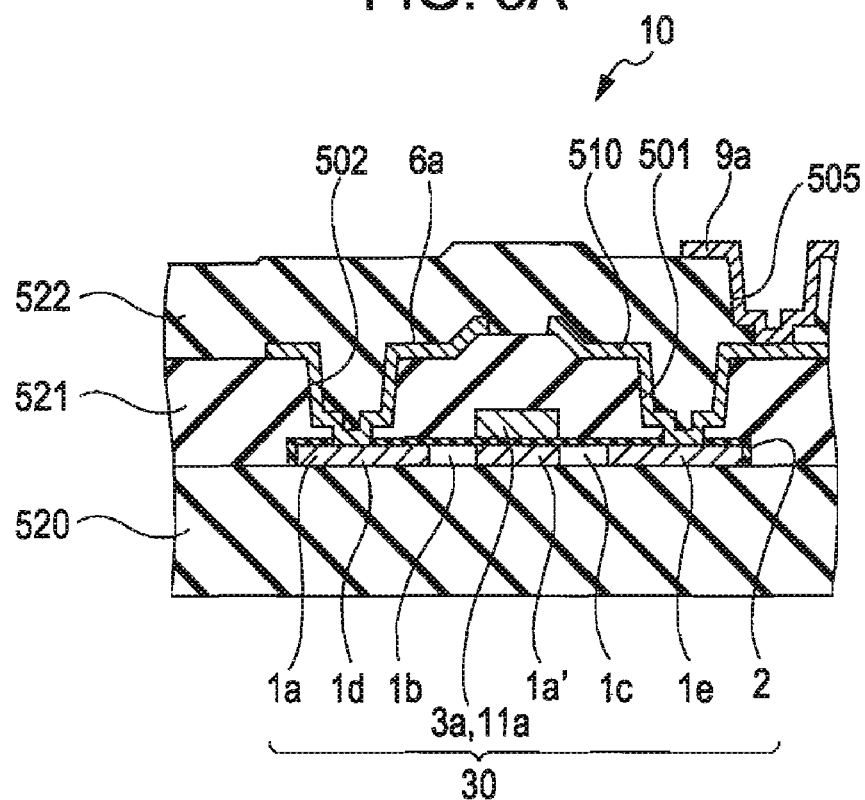
FIG. 5A is a cross-sectional view of a pixel portion of a TFT array substrate taken along the line VA-VA of FIG. 4.
Figure 5B:
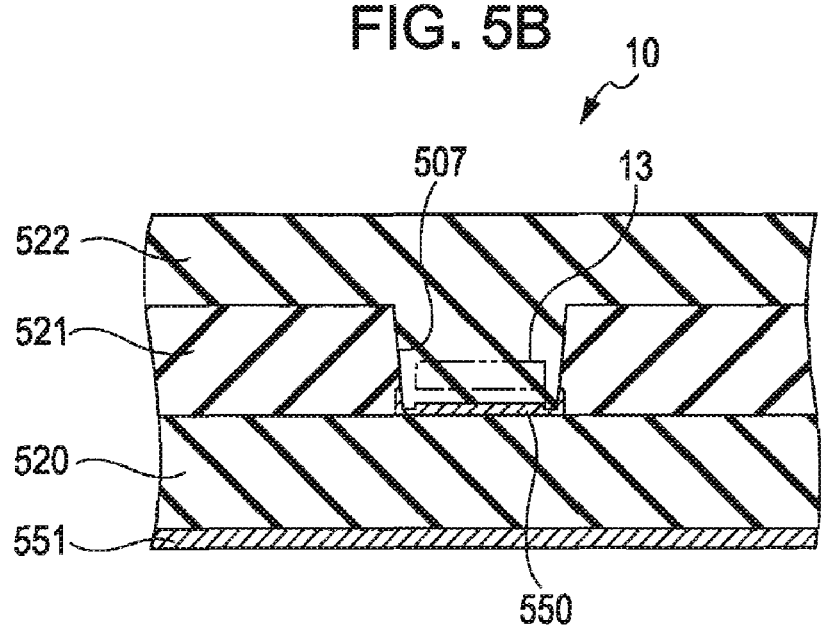
FIG. 5B is a cross-sectional view of a cut short-circuit portion C of scanning lines taken along the line VB-VB of FIG. 4.

Next, the structure of the TFT array substrate 10 in the electro-optical device according to this embodiment will be described with reference to FIGS. 5A and 5B. FIG. 5A is a cross-sectional view of a pixel portion of the TFT array substrate 10 taken along the line VA-VA of FIG. 4. FIG. 5B is a cross-sectional view of a cut short-circuit portion C of the scanning lines 11a taken along the line VB-VB of FIG. 4. As shown in FIGS. 5A and 5B, on the TFT array substrate 10, in addition to the pixel electrodes 9a, various parts are disposed to have a laminated structure. In FIGS. 5A and 5B, the scale of each layer or part has been adjusted in order to have a recognizable size.

As shown in FIGS. 5A and 5B, on the TFT array substrate 10 formed of, for example, a quartz substrate, a glass substrate, or a silicon substrate, a base insulating film 520 is formed. On the base insulating film 520, a plurality of scanning lines 11a (not shown) formed of, for example, a conductive polysilicon film are formed, and the TFTs 30 including the gate electrodes 3a formed of the same film as the scanning lines 11a are provided. Further, as shown in FIG. 5B, below the base insulating film 520 of the short-circuit portions C of the scanning lines 11a, a lower light-shielding film 551 formed of a metal film, such as tungsten or the like, is formed.

As described with reference to FIG. 4, the plurality of scanning lines 11a are formed to be electrically connected to the common line 13 of the same layer and then short-circuited to one another. Subsequently, the common line 13 is cut in the individual short-circuit portions C. Here, the scanning lines 11a and the common line 13 are formed of a conductive layer of the same layer as the gate electrodes 3a constituting the TFT 30 serving as the driving elements.

The TFT 30 has an LDD (Lightly Doped Drain) structure. Each of the TFTs 30 has the gate electrode 3a, a semiconductor film 1a, and a gate insulating film 2 that isolates the gate electrode 3a from the semiconductor film 1a. The semiconductor film 1a is formed of, for example, polysilicon, and has a channel region 1a', in which a channel is formed by an electrical field from the gate electrode 3a, a lightly doped source region 1b, a heavily doped source region 1d, a lightly doped drain region 1c, and a heavily doped drain region 1e.

Then, on the scanning line 11a and the TFT 30, a first interlayer insulating film 521, formed of a BPSG film, is formed. In the first interlayer insulating film 521, contact holes 501 and 502 are formed to pass through the first interlayer insulating film 521 and the gate insulating film 2 and to extend from the surface of the first interlayer insulating film 521 to the surfaces of the heavily doped drain region 1e and the heavily doped source region 1d of the semiconductor film 1a, respectively. Then, conductive films that are formed of conductive materials containing aluminum are successively formed from the bottom portions of the contact holes 501 and 502 to the side walls and the surface of the first interlayer insulating film 521. On the first interlayer insulating film 521, a drain electrode 510 and the data line 6a are formed using parts of the conductive films, respectively. The drain electrode 510 is electrically connected to the heavily doped drain region 1e of the TFT 30 through the contact hole 501. Further, the data line 6a is connected to the heavily doped source region 1d of the TFT 30 through the contact hole 502. The first interlayer insulating film 521 isolates the layer of the TFT 30 from the layer of the data line 6a.

As shown in FIG. 5B, in the short-circuit portion C of the scanning lines 11a, the common line 13 is cut by a cutting hole 507 that is formed to pass through the first interlayer insulating film 521. The cutting hole 507 is formed to pass through the first interlayer insulating film 521 and also to pass through the conductive layer constituting the scanning lines 11a so as to cut the common line 13. Then, an etching stopping layer 550 is formed below the cutting hole 507. The etching stopping layer 550 is formed below the common line 13 to have an external shape larger than the external shape of the cutting hole 507 at the same position as the cutting hole 507 in plan view, that is, as viewed from a direction perpendicular to the surface of the TFT array substrate 10. The etching stopping layer 550 is formed of a polysilicon film in the same layer as the semiconductor film 1a of the TFT 30 and has insulation.

A second interlayer insulating film 522, formed of, for example, a BPSG film, is formed on the first interlayer insulating film 521. Then, in the second Interlayer insulating film 522, a contact hole 505 is formed to pass through the second interlayer insulating film 522 and to extend from the surface of the second interlayer insulating film 522 to the surface of the drain electrode 510. The pixel electrode 9a that is formed of a transparent conductive film, such as an ITO film, is successively formed from the bottom portion of the contact hole 505 to the side wall and the surface of the second interlayer insulating film 522.

A method of manufacturing an electro-optical device having the above-described structure according to this embodiment will be described below with reference to FIGS. 6A to 8C. FIGS. 6A to 8C are cross-sectional process views sequentially showing the configuration of the TFT array substrate 10 in individual steps of a manufacturing process relative to the cross-sectional views of FIGS. 5A and 5B. In each of FIGS. 6A to 8C, the configuration of the pixel portion of the TFT array substrate 10 is shown on the left side in cross-sectional view, and the configuration of the short-circuit portion C of the scanning lines 11a is shown on the right side in cross-sectional view. In FIGS. 6A to 8C, the scale of each layer or part has been adjusted in order to have a recognizable size.

Hereinafter, a manufacturing process of the pixel portion of the TFT array substrate 10 and the common line 13 in the short-circuit portion C of the scanning lines 11a shown in FIGS. 5A and 5B will be described in detail. The descriptions of manufacturing steps of other parts shown in FIGS. 1 to 3 will be omitted.

Figure 6A:
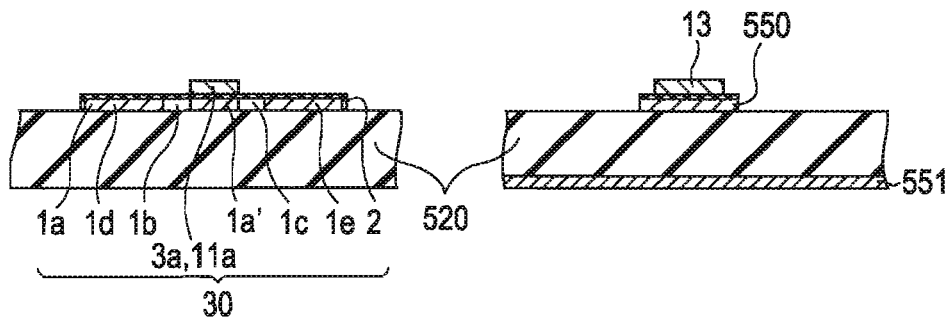
FIGS. 6A to 6D are cross-sectional views sequentially showing the configuration of a TFT array substrate in individual steps of a manufacturing process.

First, at Step shown in FIG. 6A, in the pixel portion, on the base insulating film 520 of the TFT array substrate 10, the TFT 30 serving as the driving element is formed. More specifically, after the semiconductor film 1a of the TFT 30 is formed by patterning a polysilicon layer in a predetermined shape, the gate insulating film 2 is formed. Subsequently, the gate electrode 3a serving as a conductive layer is formed on the gate insulating film 2. Next, impurity ions are doped into the semiconductor film 1a of the TFT 30 at two stages of lightly doping and heavily doping, such that the lightly doped source region 1b and the lightly doped drain region 1c, and the heavily doped source region 1d and the heavily doped drain region 1e are formed in the semiconductor film 1a.

At Step shown in FIG. 6A, in the short-circuit portion C of the scanning lines 11a, on the base insulating film 520, the etching stopping layer 550 formed of a polysilicon layer is formed by the same process as that for forming the semiconductor film 1a. The etching stopping layer 550 is formed at a position corresponding to the cutting hole 507 to be subsequently formed as viewed from the direction perpendicular to the surface of the TFT array substrate 10. Further, the etching stopping layer 550 is formed within a range larger than the external shape of the bottom surface of the cutting hole 507. For example, the etching stopping layer 550 is formed within a region surrounded by a line at a distance of about 250 nm from the external shape of the bottom surface of the cutting hole 507 as viewed from the direction perpendicular to the surface of the TFT array substrate 10. Moreover, in the polysilicon layer constituting the etching stopping layer 550, impurity ions are not doped. For this reason, the etching stopping layer 550 has insulation.

In addition, after the etching stopping layer 550 is formed, the plurality of scanning lines 11a and the common line 13 that are formed of the conductive layer of the same layer as the gate electrode 3a are formed on the base insulating film 520 and the etching stopping layer 550 by the same process for forming the conductive layer of the gate electrode 3a of the TFT 30 serving as the driving element. At this time, the plurality of scanning lines 11a are formed to be electrically connected by the common line 13 so as to be short-circuited to one another. The common line 13 is formed at a position substantially passing through the center of the cutting hole 507 to be subsequently formed in the short-circuit portion C of the scanning lines 11a as viewed from the direction perpendicular to the surface of the TFT array substrate 10. Further, the common line 13 is formed to have a width thinner than the external shape of the bottom surface of the cutting hole 507.

Figure 6B:
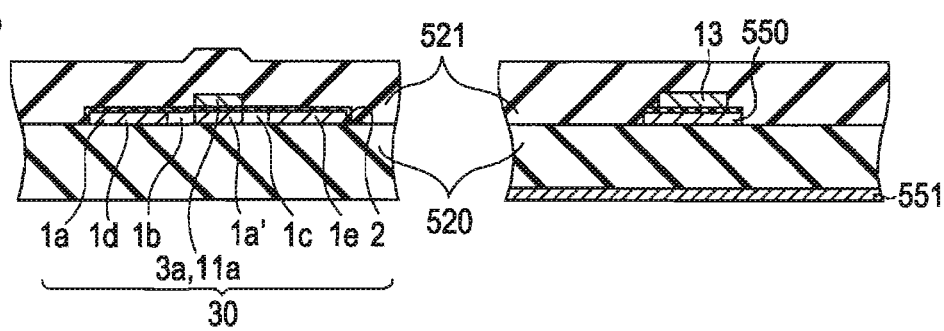

Next, at Step shown in FIG. 6B, the first interlayer insulating film 521, formed of a BPSG film is formed, for example, by an atmospheric CVD method.

Figure 6C:
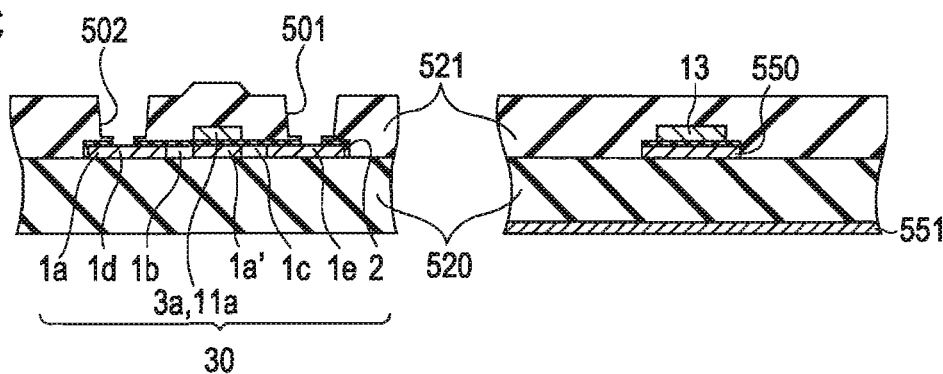

Next, at Step shown in FIG. 6C, the contact hole 501 and 502 are formed in the first interlayer insulating film 521 to pass through first interlayer insulating film 521 and to reach the surfaces of the heavily doped drain region 1e and the heavily doped source region 1d of the TFT 30, respectively.

Figure 6D:
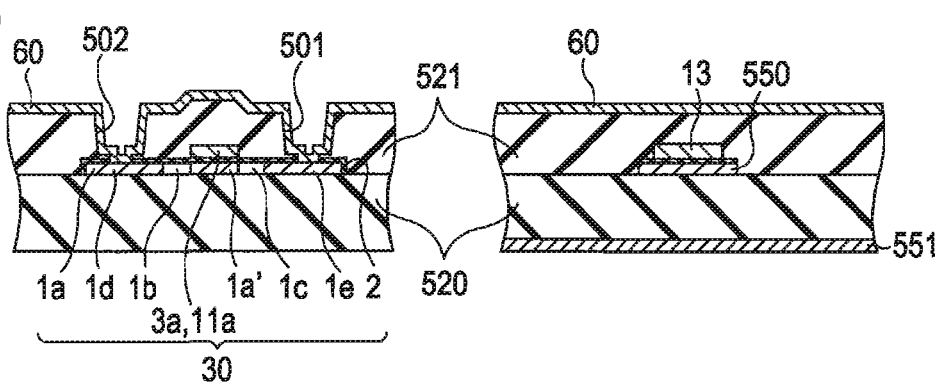

Next, at Step shown in FIG. 6D, a conductive film 60 formed of, for example, a conductive material containing aluminum is formed on the entire surface of the first interlayer insulating film 521 by a sputtering method or the like. At this time, the conductive film 60 is successively formed from the bottom portions of the contact holes 501 and 502 to the side walls and the surface of the first Interlayer insulating film 521.

Figure 7A:
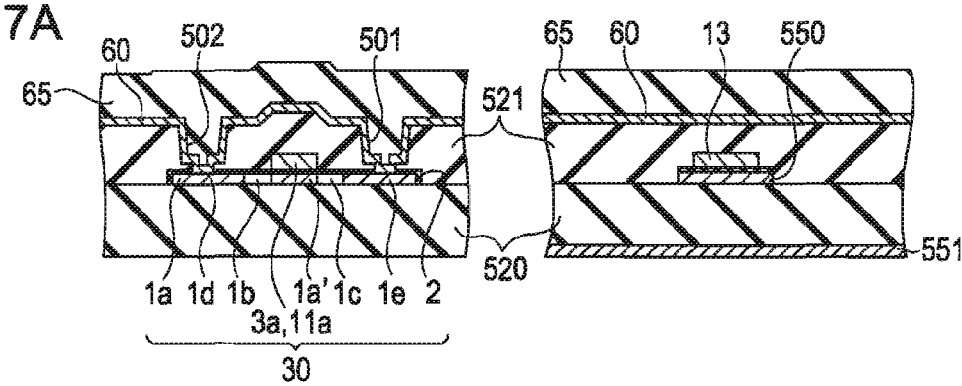
FIGS. 7A to 7D are cross-sectional views sequentially showing the configuration of a TFT array substrate in individual steps of a manufacturing process.
Figure 7B:
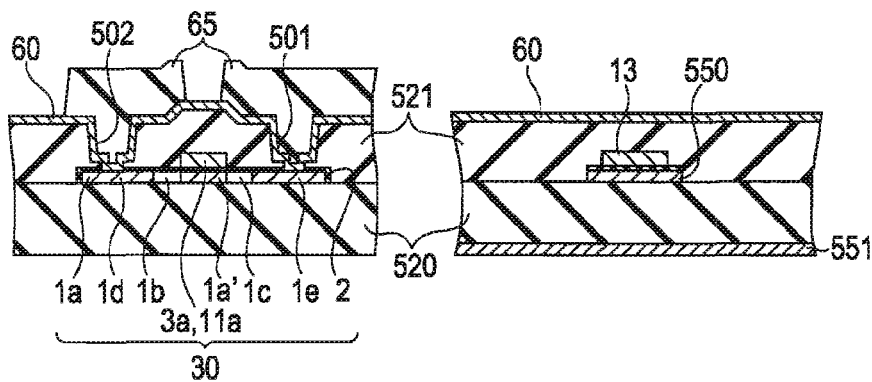

Next, at Step shown in FIG. 7A, a resist 65 is formed on the conductive film 60. At this time, the first interlayer insulating film 521 is formed on the short-circuit portion c of the scanning lines 11a, and the conductive film 60 and the resist 65 are formed on first interlayer insulating film 521. Next, at Step shown in FIG. 7B, the resist 65 is patterned by a photolithography method. At this time, in the pixel portion, the resist 65 is patterned to correspond to the data line 6a and the drain electrode 510. Accordingly, in the short-circuit portion C of the scanning lines 11a, the resist 65 on the conductive film 60 is removed.

Figure 7C:
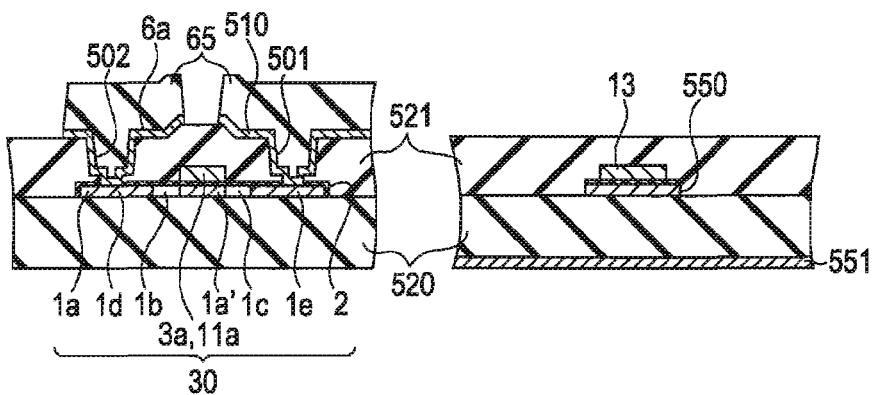

Next, at Step shown in FIG. 7C, dry etching is performed on the conductive film 60 through the resist 65 using a $Cl_2$ gas, and thus the data line 6a and the drain electrode 510 are formed to have patterns corresponding to resist 65. At this time, in the short-circuit portion C of the scanning lines 11a, the conductive film 60 on the first interlayer insulating film 521 is removed. After the data line 6a and the drain electrode 510 are formed by etching, the resist 65 is removed.

Figure 7D:
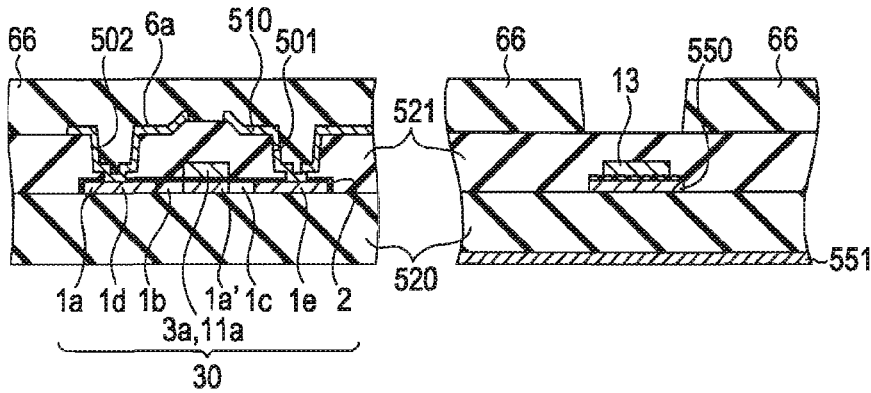

Next, at Step shown in FIG. 7D, on the first interlayer insulating film 521, a resist 66 is newly formed above the data line 6a and the drain electrode 510 as a pattern for defining the cutting hole 507.

Next, at Step shown in FIG. 8A, the cutting hole 507 is formed in the first interlayer insulating film 521 through the resist 66, for example, by a drying etching method so as to pass through the first interlayer insulating film 521 and to cut the common line 13 in the short-circuit portion C of the scanning lines 11a. More specifically, dry etching for removing the first interlayer insulating film 521 to the surface the common line 13 is performed using a mixed gas of $CHF_3$ and $CF_4$ as an etchant. Subsequently, dry etching for removing the common line 13 is performed using HBr or the like as an etchant.

At this time, the etching stopping layer 550 is formed below the common line 13 in the short-circuit portion C of the scanning lines 11a. Therefore, there is no case where dry etching on the common line 13 reaches the base insulating film 520 below the etching stopping layer 550 by Step shown in FIG. 8A. After the cutting hole 507 is formed by etching, the resist 66 is removed.

Next, at Step shown in FIG. 8B, the second interlayer Insulating film 522 is formed of the BPSG film above the data line 6a and the drain electrode 510, for example, by an atmospheric or reduced-pressure CVD method.

Next, at Step shown in FIG. 8C, the contact hole 505 is formed in the second interlayer insulating film 522 to reach the surface of the drain electrode 510. Subsequently, an ITO film is successively formed from the bottom portion of the contact hole 505 to the side wall and the surface of the second interlayer insulating film 522. Then, the ITO film is patterned by a photolithography method and an etching method, such that the pixel electrode 9a is formed.

With the above-described processes, an electro-optical device according to this embodiment having the structure shown in FIG. 5 is manufactured.

In this embodiment, after the plurality of scanning lines 11a are formed to be short-circuited to one another, the impurity ions are doped into the semiconductor film 1a of the TFT 30 or the conductive film 60 constituting the data line 6a is formed. Accordingly, at the time of forming the conductive film 60 by the plasma CVD method or the like or at the time of doping impurity ions, the charges accumulated in the surface of the TFT array substrate 10 can be diffused outside the surface of the TFT array substrate 10 through the common line 13 that electrically connects the plurality of scanning lines 11a to be short-circuited to one another. Therefore, it is possible to prevent the data line 6a or the TFT 30 serving as essential parts for driving the pixel electrode 9a from being damaged due to an unexpected excess current caused by an electrostatic charge in the surface of the TFT array substrate 10.

According to this embodiment, the formation of the contact holes 501 and 502 in the first interlayer insulating film 521, and the formation of the cutting hole 507 in the first interlayer insulating film 521 are performed at separate steps. Accordingly, there is no case where the conductive film 60 or the resist 65 is formed in the cutting hole 507. Therefore, at the time of cutting the common line 13 in the short-circuit portion C of the scanning lines 11a, etching does not need to be performed in the cutting hole 507. In addition, according to this embodiment, below the common line 13 in the short-circuit portion C of the scanning lines 11a, the etching stopping layer 550 is formed within the range larger than the external shape of the bottom surface of the cutting hole 507. For this reason, the common line 13 is reliably cut by etching that is performed to cut the common line 13, and etching reliably stops in the etching stopping layer 550. Therefore, according to this embodiment, in the short-circuit portion C of the scanning lines 11a, there is no case where the base insulating film 520 is thinned by etching for cutting the common line 13 or etching reaches the lower light-shielding film 551. For this reason, there is no case where cracks occur in the lower light-shielding film 551 in the periphery of the short-circuit portion C of the scanning lines 11a, and light leakage occurs from the cracks.

According to the method of manufacturing an electro-optical device of this embodiment, it is possible to stably manufacture an electro-optical device having high display quality, which does not have a display inconsistency due to damages to the TFTs 30 by the accumulation of the charges to the TFT array substrate 10 or light leakage from cracks in the lower light-shielding film 551 in the periphery of the short-circuit portion C by cutting of the short-circuit portion C of the scanning lines 11a.

The etching stopping layer 550 is formed simultaneously with a process for forming the semiconductor film 1a of the TFT 30. For this reason, the etching stopping layer 550 can be formed without complicating the process compared with a manufacturing process of an electro-optical device according to the related art.

Figure 9A:
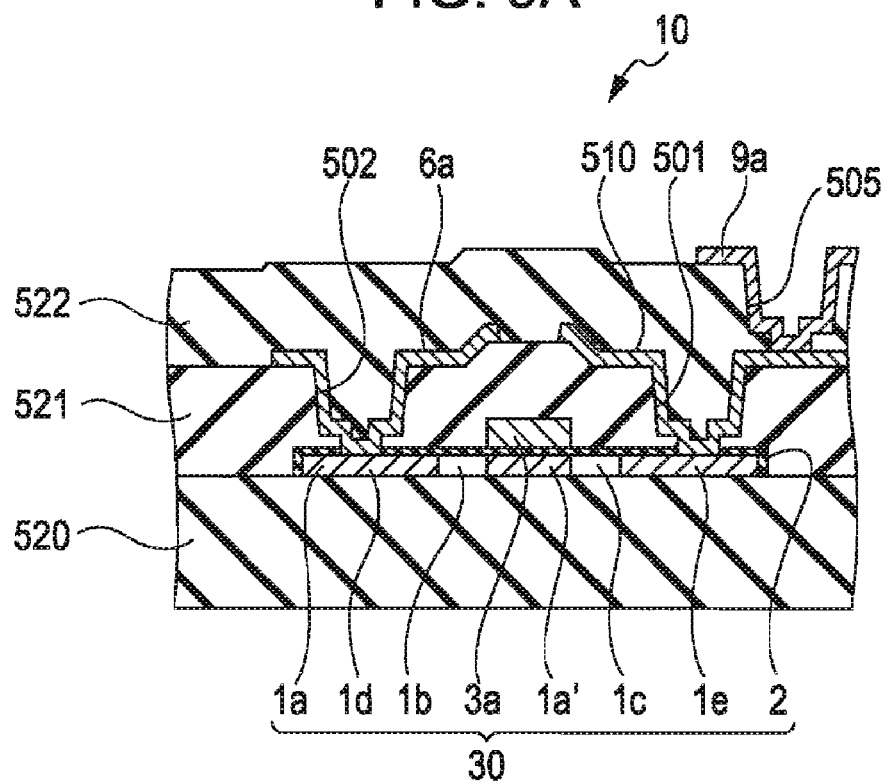
FIG. 9A is a cross-sectional view of a pixel portion of a TFT array substrate taken along the line IXA-IXA of FIG. 4.
Figure 9B:
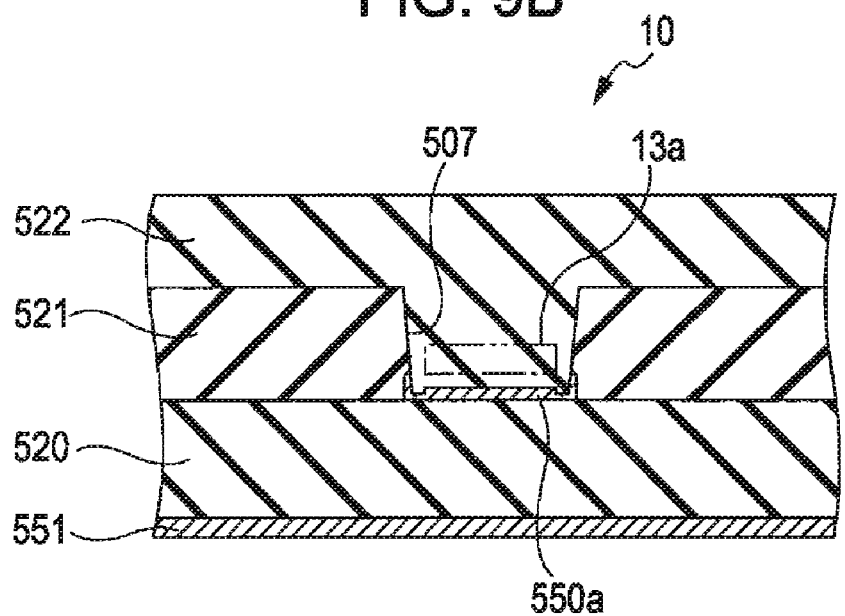
FIG. 9B is a cross-sectional view of a cut short-circuit portion C of a scanning line taken along the line IXB-IXB of FIG. 4.

In the method of manufacturing an electro-optical device according to the this embodiment described above, the scanning lines 11a and the common line 13 are formed simultaneously with the gate electrodes 3a of the TFTs 30. Alternatively, the scanning lines 11a and the common line may be formed by a separate process from the process for forming the gate electrodes 3a of the TFTs 30. For example, as shown in FIG. 9B, an etching stopping layer 550a is formed simultaneously with the semiconductor film 1a or the gate electrodes 3a of the TFTs 30. After the gate electrodes 3a are formed, the scanning lines 11a and the common line 13a are formed. Processes after the scanning lines 11a and the common line 13a are the same as those in the above-described embodiment.

The invention belongs to a technical field of an electro-optical device, for example, an electrophoretic device, such as an electronic paper or the like, an electroluminescent (EL) display device, a device having electron emission circuit elements (Field Emission Display or Surface-Conduction Electron-Emitter Display), in addition to an active matrix driving mode liquid crystal device according to this embodiment.

The invention is not limited to the above-described embodiment, but various modifications can be made within the scope without departing from the spirit or idea of the invention defined by the appended claims and the entire specification. Therefore, a method of manufacturing an electro-optical device that accompanies such modifications still falls within the technical scope of the invention.

What is claimed is:

1. A method of manufacturing an electro-optical device, that has a matrix of pixels, a peripheral area surrounding the matrix of pixels, data lines, scanning lines, driving elements formed to correspond to intersections of the data lines and the scanning lines for individual pixels of the matrix of pixels, and pixel electrodes provided to correspond to the driving elements, the method of manufacturing an electro-optical device comprising:

forming a lower light-shielding film in the peripheral area surrounding the matrix of pixels;

forming a base insulation layer over the light-shielding film;

forming an etching stopping layer over the base insulation layer, the etching stopping layer being formed from a semiconductor layer;

forming driving elements;

forming a common line above the etching stopping layer, the common line short-circuiting the scanning lines;

forming a first interlayer insulating film over the scanning lines and the driving elements;

forming contact holes through the first interlayer insulating film to the driving elements;

forming data lines electrically connected to the driving elements through the contact holes; and forming a cutting hole in the first interlayer insulating film by etching so as to cut the common line without passing through the lower light-shielding film.

2. The method of manufacturing an electro-optical device according to claim 1, wherein the etching stopping layer is a semiconductor film that is formed simultaneously with semiconductor films of the driving elements.

3. The method of manufacturing an electro-optical device according to claim 1, wherein the etching stopping layer is formed wider than the cutting hole so as to include the cutting hole in plan view.

4. The method of manufacturing an electro-optical device according to claim 1, wherein the common line and the scanning lines are formed simultaneously with forming gate electrodes constituting the driving elements.

5. The method of manufacturing an electro-optical device according to claim 1, wherein the etching stopping layer is formed wider than the cutting hole so as to include the cutting hole in plan view.

6. The method of manufacturing an electro-optical device according to claim 1, wherein the common line and the scanning lines are formed after the gate electrodes constituting the driving elements, and the common line and the scanning lines are formed simultaneously.

7. The method of manufacturing an electro-optical device according to claim 1, wherein the common line and the scanning lines are formed simultaneously in the same process and from the same material.

8. A method of manufacturing an electro-optical device, the method comprising:

forming a lower light-shielding film in a peripheral area surrounding a matrix of pixels;

forming a base insulation layer of the light-shielding;

forming an etching stopping layer over the base insulation layer, the etching stopping layer being formed from a semiconductor layer;

forming driving elements over the base insulation layer;

forming scanning lines and a common line in the same process and from the same material above the etching stopping layer, the common line short-circuiting the scanning lines;

forming a first interlayer insulating film over the scanning lines and the driving elements;

forming contact holes through the first interlayer insulating film to the driving elements;

forming a conductive film over the first interlayer insulating film and into the contact holes;

patterning the conductive film to form data lines and electrodes electrically connected to the driving elements;

forming a resist over the first interlayer insulating film, the data lines and the electrodes;

forming an opening in the resist at a location that corresponds to the common line and to the etching stopping layer; and simultaneously removing the resist and forming a cutting hole in the first interlayer insulating film by etching so as to cut the common line.

* * * * *